United States Patent
Hirose et al.

(10) Patent No.: US 11,811,383 B2
(45) Date of Patent: Nov. 7, 2023

(54) NOISE FILTER AND POWER SUPPLY DEVICE

(71) Applicant: MITSUBISHI ELECTRIC CORPORATION, Tokyo (JP)

(72) Inventors: Kenji Hirose, Tokyo (JP); Kyota Otsuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 124 days.

(21) Appl. No.: 17/518,639

(22) Filed: Nov. 4, 2021

(65) Prior Publication Data

US 2022/0060162 A1 Feb. 24, 2022

Related U.S. Application Data

(63) Continuation of application No. PCT/JP2019/022747, filed on Jun. 7, 2019.

(51) Int. Cl.
| | | |
|---|---|---|
| *H03H 7/01* | (2006.01) | |
| *H03H 1/00* | (2006.01) | |
| *H02M 1/12* | (2006.01) | |
| *H01F 17/06* | (2006.01) | |
| *H03H 7/42* | (2006.01) | |
| *H05K 1/16* | (2006.01) | |

(52) U.S. Cl.
CPC ........... *H03H 7/0153* (2013.01); *H01F 17/06* (2013.01); *H02M 1/123* (2021.05); *H03H 7/427* (2013.01); *H05K 1/16* (2013.01); *H03H 1/0007* (2013.01)

(58) Field of Classification Search
CPC ... H03H 7/0153; H03H 7/0115; H03H 1/0007
USPC ........................................ 333/181, 185, 175
See application file for complete search history.

(56) References Cited

U.S. PATENT DOCUMENTS

| | | | | |
|---|---|---|---|---|
| 10,979,014 | B2* | 4/2021 | Taniguchi | ............. H02M 7/003 |
| 2021/0366642 | A1* | 11/2021 | Herrmann | ............... H01F 37/00 |

FOREIGN PATENT DOCUMENTS

JP 2016-31965 A 3/2016

* cited by examiner

*Primary Examiner* — Rakesh B Patel
(74) *Attorney, Agent, or Firm* — Birch, Stewart, Kolasch & Birch, LLP

(57) ABSTRACT

A noise filter includes: a first bus bar that is electrical wiring of a flat plate, the first bus bar including a first extending wiring portion extending in a first direction, a second extending wiring portion extending in a second direction that is a direction opposite to the first direction, and a first coupling wiring portion connecting the first extending wiring portion and the second extending wiring portion; a first lead conductor having a first end connected with the first coupling wiring portion; a first capacitor having a first end connected with a second end of the first lead conductor and a second end connected with a ground; and a magnetic core having an opening in a central portion, the magnetic core disposed in such a manner that the first coupling wiring portion passes through the opening.

4 Claims, 14 Drawing Sheets

ESL = $L_{wire}$
  + $L_c$
  + $L_{pattern}$
  + $L_{spacer}$

NOISE FILTER AND POWER SUPPLY DEVICE

CROSS REFERENCE TO RELATED APPLICATIONS

This application is a Continuation of PCT International Application No. PCT/JP2019/022747, filed on Jun. 7, 2019, which is hereby expressly incorporated by reference into the present application.

TECHNICAL FIELD

The present invention relates to a noise filter including a capacitor and a power supply device.

BACKGROUND ART

Patent Literature 1 below discloses a printed board on which a noise filter that reduces electromagnetic noise that leaks to a power supply side is mounted.

In the printed board disclosed in Patent Literature 1, four or more conductor layers including a conductor layer in which a power supply line connected to a power supply terminal of a circuit element is disposed and a conductor layer in which a ground plane is formed are stacked.

In a first layer, which is one of the conductor layers included in the printed board disclosed in Patent Literature 1, a reactor is formed by deformation of a power supply line.

Also in a second layer, which is one of the conductor layers included in the printed board disclosed in Patent Literature 1, a reactor is formed by deformation of the power supply line. The reactor formed in the first layer and the reactor formed in the second layer are connected in series.

One end of a capacitor is connected with wiring drawn out from between the reactor formed in the first layer and the reactor formed in the second layer, and the other end of the capacitor is connected to the ground plane.

CITATION LIST

Patent Literature

Patent Literature 1: JP 2016-031965 A

SUMMARY OF INVENTION

Technical Problem

For example, in a power supply device that handles a large current, such as an inverter device for driving a motor, there are cases that a bus bar is used as a power supply line.

In a case where a structure like the printed board disclosed in Patent Literature 1 is applied to a power supply device using a bus bar as a power supply line in order to reduce electromagnetic noise that leaks to the power supply side, it is necessary to form each of a reactor formed in a first layer and a reactor formed in a second layer by the bus bar. In addition, a lead wire drawn from between the reactor formed in the first layer and the reactor formed in the second layer also needs to be formed by the bus bar.

The bus bar is typically manufactured by punching or pressing a metal plate or the like, and it is difficult to manufacture a bus bar having a complicated three-dimensional shape. That is, even if it is attempted to apply a structure like the printed board disclosed in Patent Literature 1 to a power supply device using a bus bar, a three-dimensional bus bar, in which two reactors having a loop-like shape are formed in mutually different layers and are connected in series, does not have a planar structure, and thus there is a problem that it is difficult to manufacture the bus bar by punching or pressing a metal plate or the like.

The present invention has been made to solve the above problems, and an object of the present invention is to obtain a noise filter and a power supply device using a bus bar having a planar structure that can be manufactured by punching, pressing, or the like.

Solution to Problem

A noise filter according to the present invention includes: a first bus bar that is electrical wiring of a flat plate, the first bus bar including a first extending wiring portion extending in a first direction, a second extending wiring portion extending in a second direction that is a direction opposite to the first direction, and a first coupling wiring portion connecting the first extending wiring portion and the second extending wiring portion; a first lead conductor having a first end connected with the first coupling wiring portion; a first capacitor having a first end connected with a second end of the first lead conductor and a second end connected with a ground; and a magnetic core having an opening in a central portion, the magnetic core disposed in such a manner that the first coupling wiring portion passes through the opening.

Advantageous Effects of Invention

According to the present invention, it is possible to implement a noise filter using a first bus bar having a planar structure that can be manufactured by punching, pressing, or the like.

DESCRIPTION OF EMBODIMENTS

In order to describe the present invention further in detail, embodiments for carrying out the invention will be described below by referring to the accompanying drawings.

First Embodiment

Figure 1:
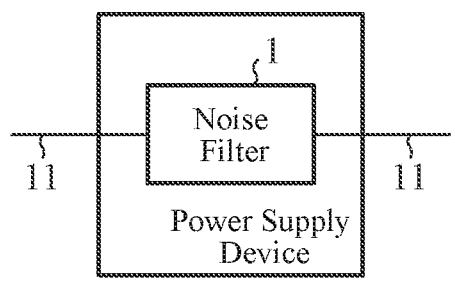
FIG. 1 is a configuration diagram illustrating a power supply device including a noise filter 1 according to a first embodiment.

FIG. 1 is a configuration diagram illustrating a power supply device including a noise filter 1 according to a first embodiment.

The power supply device is, for example, a power electronics device that handles a large current, such as an inverter device for driving a motor. Note that, the power supply device is not limited to the inverter device for driving a motor and may be, for example, a DC-DC converter such as a switching regulator.

The power supply device uses a first bus bar 11 as a power supply line, and a noise filter 1 is inserted in the first bus bar 11.

The noise filter 1 is inserted in the first bus bar 11 in order to suppress electromagnetic noise propagated in the first bus bar 11, and the noise filter 1 includes a part of the first bus bar 11.

Figure 2:
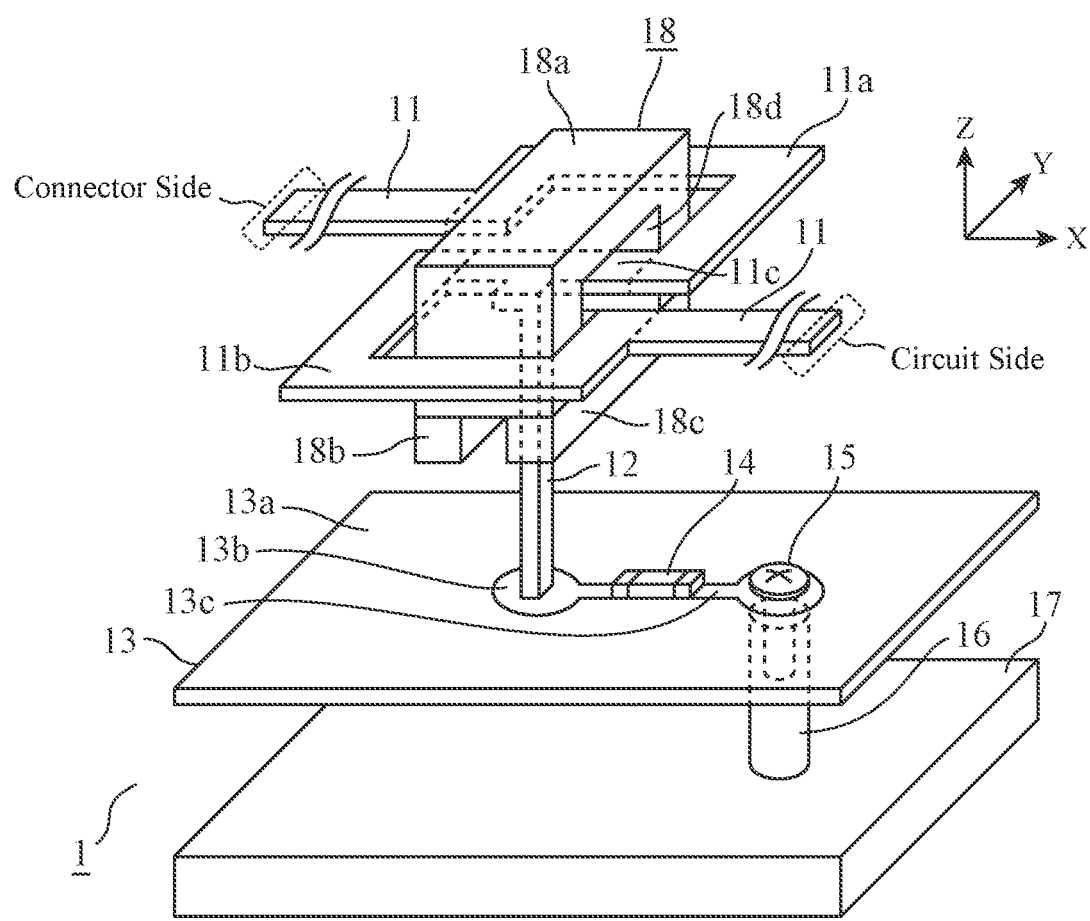
FIG. 2 is a perspective view illustrating the noise filter 1 according to the first embodiment.

FIG. 2 is a perspective view illustrating the noise filter 1 according to the first embodiment.

Figure 3:
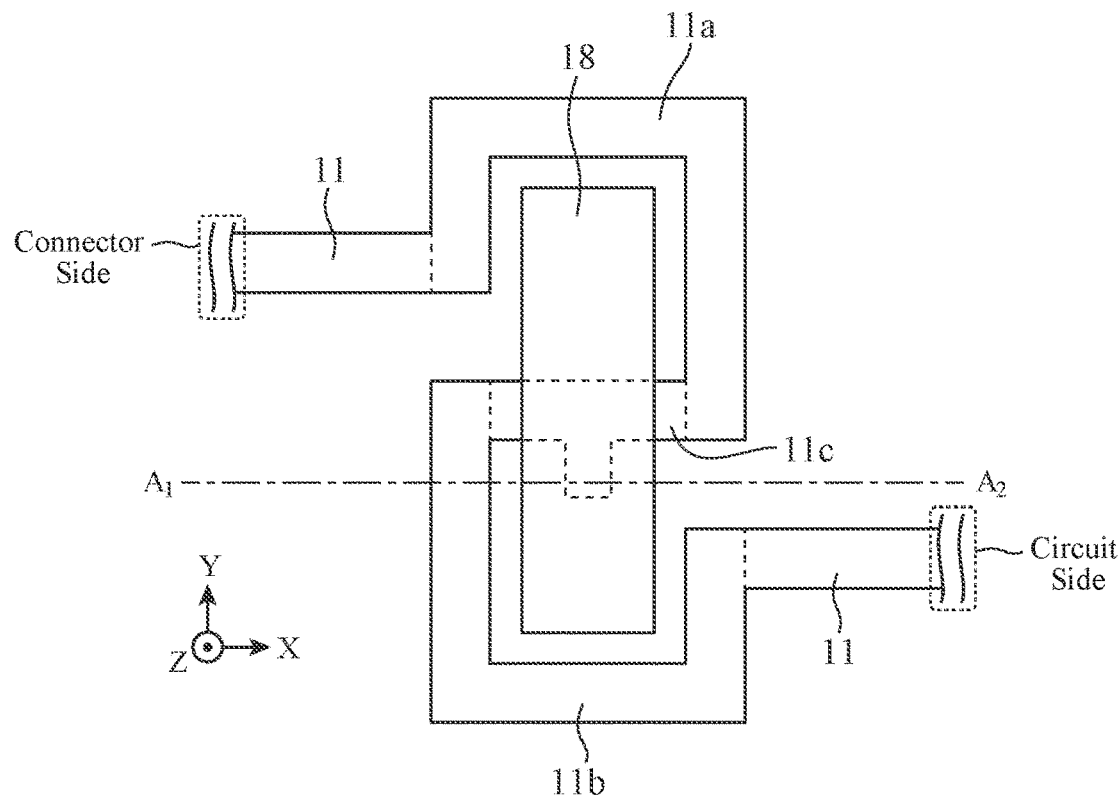
FIG. 3 is a top view of the noise filter 1 illustrated in FIG. 2 as viewed from +Z direction.

FIG. 3 is a top view of the noise filter 1 illustrated in FIG. 2 as viewed from +Z direction.

Figure 4:
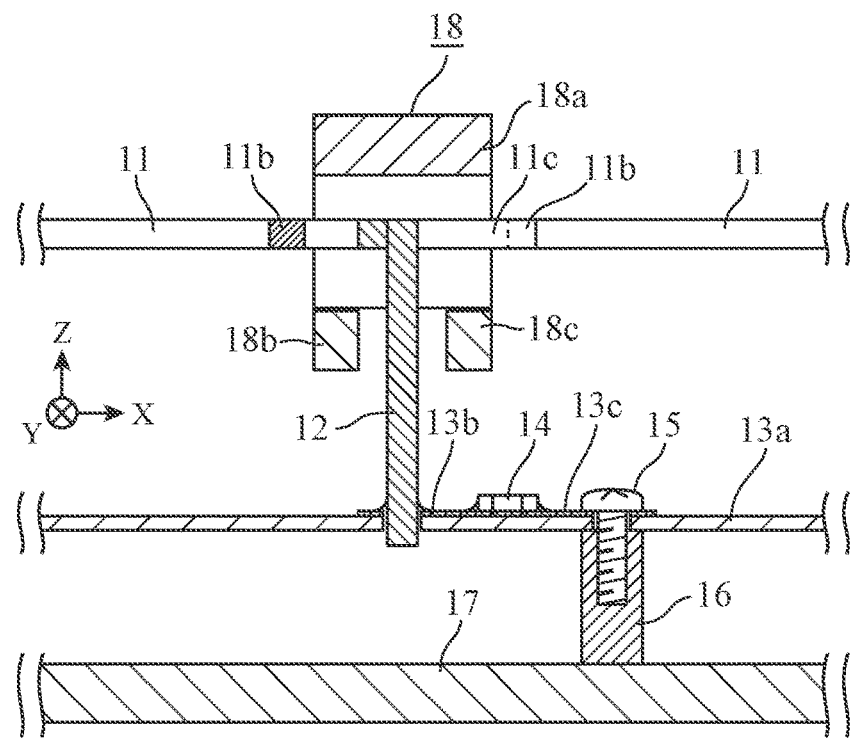
FIG. 4 is a cross-sectional view of cross section $A_1$-$A_2$ illustrated in FIG. 3 as viewed from −Y direction.

FIG. 4 is a cross-sectional view of cross section $A_1$-$A_2$ illustrated in FIG. 3 as viewed from −Y direction.

Figure 5:
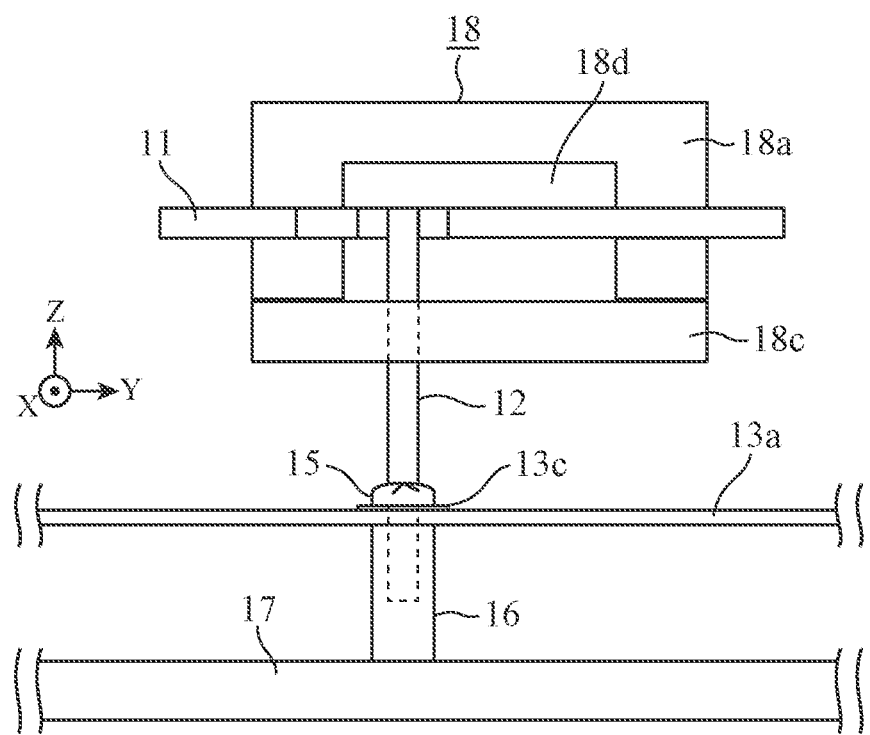
FIG. 5 is a Y-Z plane view of the noise filter 1 illustrated in FIG. 2 as viewed from +X direction.

FIG. 5 is a Y-Z plane view of the noise filter 1 illustrated in FIG. 2 as viewed from +X direction.

Figure 6A:
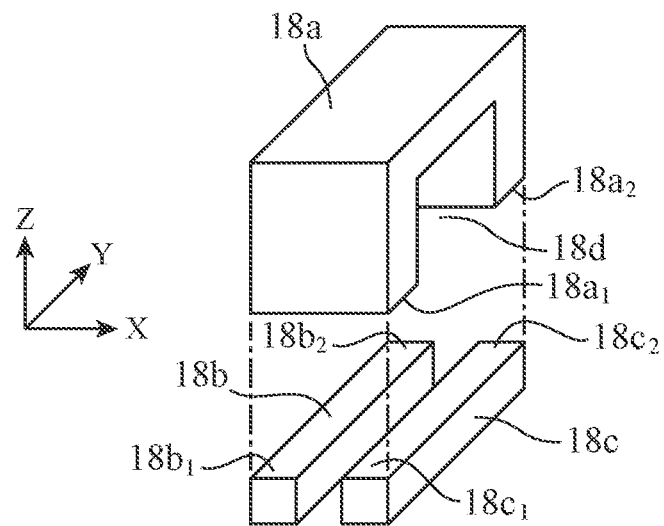
FIG. 6A is a perspective view illustrating the structure of a magnetic core 18 in the noise filter 1 illustrated in FIG. 2.

FIG. 6A is a perspective view illustrating the structure of a magnetic core 18 in the noise filter 1 illustrated in FIG. 2.

Figure 6B:
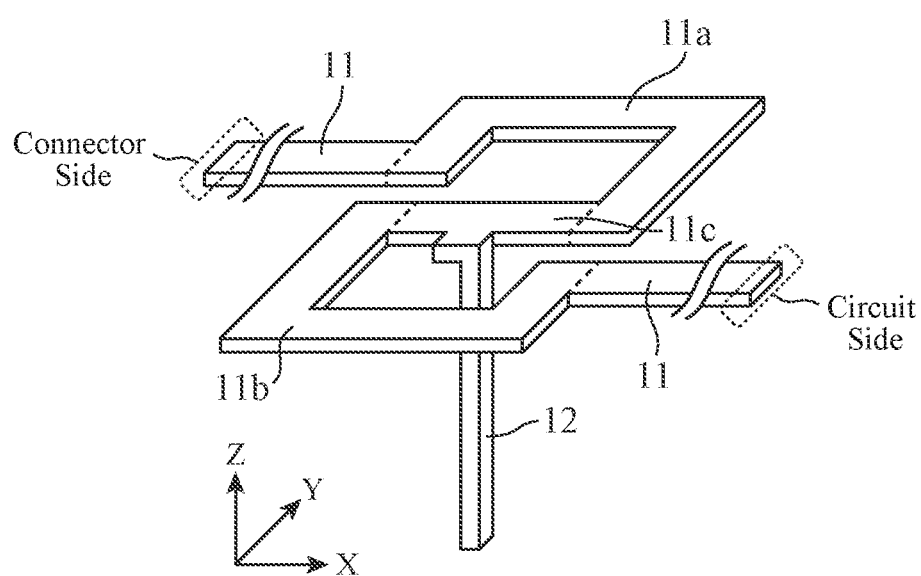
FIG. 6B is a perspective view illustrating the structure of a first bus bar 11 in the noise filter 1 illustrated in FIG. 2.

FIG. 6B is a perspective view illustrating the structure of the first bus bar 11 in the noise filter 1 illustrated in FIG. 2.

In FIGS. 2 to 6, the noise filter 1 is installed on a certain plane parallel to a plane including the X axis and the Y axis in a three-dimensional space defined by the X axis, the Y axis, and the Z axis. Hereinafter, this plane is referred to as an X-Y plane.

A direction parallel to the X axis is referred to as the X direction, a direction parallel to the Y axis is referred to as the Y direction, and a direction parallel to the Z axis is referred to as the Z direction.

The Z direction is a direction parallel to a normal line with respect to the surface of a printed board 13.

The X direction is a direction parallel to the surface of the printed board 13. The Y direction is a direction parallel to the surface of printed board 13 and orthogonal to the X direction.

The first bus bar 11 is installed on an X-Y plane.

The first bus bar 11 is electrical wiring of a flat plate having one end connected with, for example, a connector connected with a voltage output terminal in a power supply and the other end connected with, for example, a motor driving circuit.

The first bus bar 11 includes a first extending wiring portion 11a extending in a first direction and a second extending wiring portion 11b extending in a second direction that is a direction opposite to the first direction.

As illustrated in FIG. 3, the first direction is a clockwise direction starting from the side connected with the connector when the first bus bar 11 is viewed from the +Z direction. As illustrated in FIG. 3, the second direction is a counterclockwise direction starting from the side connected with the connector when the first bus bar 11 is viewed from the +Z direction.

In addition, the first bus bar 11 includes a first coupling wiring portion 11c that coupling the first extending wiring portion 11a and the second extending wiring portion 11b.

In the noise filter 1 illustrated in FIG. 2, the first extending wiring portion 11a, the second extending wiring portion 11b, and the first coupling wiring portion 11c are integrally formed.

In the noise filter 1 illustrated in FIG. 2, the first direction is the clockwise direction, and the second direction is the counterclockwise direction. However, this is merely an example, and the first direction may be the counterclockwise direction, and the second direction may be the clockwise direction. That is, the first bus bar 11 may have a first extending wiring portion 11a extending counterclockwise and a second extending wiring portion 11b extending clockwise.

A first lead conductor 12 is electrical wiring of a flat plate having one end connected with the first coupling wiring portion 11c and the other end connected with a wiring pattern 13b formed on the printed board 13.

The printed board 13 is installed on an X-Y plane.

A first capacitor 14 is mounted on the printed board 13.

An insulator 13a is an insulating layer of the printed board 13.

The wiring pattern 13b is conductive electric wiring and is connected with each of the other end of the first lead conductor 12 and one end of the first capacitor 14.

A ground pattern 13c is conductive electric wiring and is connected with the other end of the first capacitor 14.

The one end of the first capacitor 14 is connected with the other end of the first lead conductor 12 via the wiring pattern 13b.

The other end of the first capacitor 14 is connected with the ground pattern 13c.

A screw 15 is formed of a conductive member.

The screw 15 fixes the printed board 13 to a spacer 16 in order to electrically connect the ground pattern 13c formed on the printed board 13 and the spacer 16.

The spacer 16 is formed of a conductive member.

The spacer 16 is secured to a housing 17 and is electrically connected with each of the ground pattern 13c and the housing 17.

The housing 17 is formed of a conductive member and is connected with a ground (not illustrated).

The magnetic core 18 is formed of a magnetic material and has an opening 18d in the central portion.

The magnetic core 18 is disposed in such a manner that the first coupling wiring portion 11c passes through the opening 18d.

The magnetic core 18 includes a first core 18a, a second core 18b, and a third core 18c.

The first core 18a is formed by molding a magnetic material into a three-sided frame shape.

As illustrated in FIG. 6A, one end $18b_1$ of the first core 18a is connected with each of one end $18b_1$ of the second core 18b and one end $18c_1$ of the third core 18c. Likewise, the other end $18a_2$ of the first core 18a is connected with each of the other end $18b_2$ of the second core 18b and the other end $18c_2$ of the third core 18c.

The second core 18b is formed by molding a magnetic material into a rectangular column.

The one end $18b_1$ of the second core 18b is connected with the one end $18a_1$ of the first core 18a, and the other end $18b_2$ of the second core 18b is connected with the other end $18a_2$ of the first core 18a.

The third core 18c is formed by molding a magnetic material into a rectangular column.

One end $18c_1$ of the third core 18c is connected with the one end $18a_1$ of the first core 18a, and the other end $18c_2$ of the third core 18c is connected with the other end $18a_2$ of the first core 18a.

The opening 18d is a space surrounded by the first core 18a, the second core 18b, and the third core 18c, and the first coupling wiring portion 11c is inserted in the opening 18d.

Figure 7:
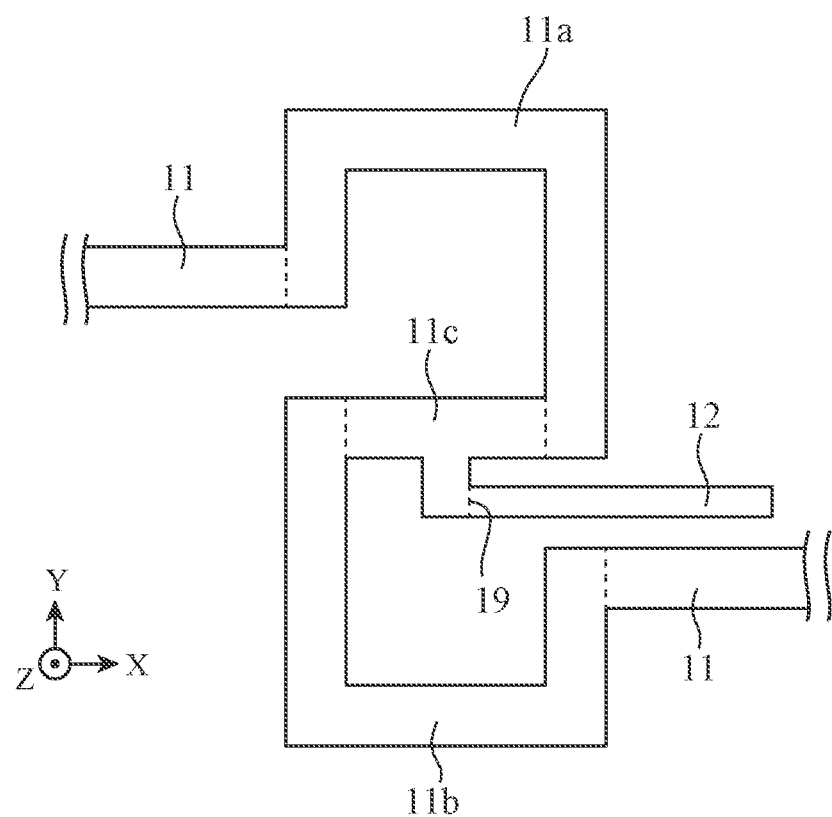
FIG. 7 is an explanatory diagram illustrating a manufacturing process of a first lead conductor 12 in the noise filter 1 illustrated in FIG. 2.

FIG. 7 is an explanatory diagram illustrating a manufacturing process of the first lead conductor 12 in the noise filter 1 illustrated in FIG. 2.

The first bus bar 11 and the first lead conductor 12 having a planar shape as illustrated in FIG. 7 are integrally formed by punching, pressing, or the like of a sheet metal.

A bent portion 19 indicates a position where the first lead conductor 12 is bent after the first bus bar 11 and the first lead conductor 12 are integrally formed.

The first lead conductor 12 is bent at the bent portion 19 to form the first bus bar 11 and the first lead conductor 12 having the shape as illustrated in FIG. 6B.

At the time of assembling the noise filter 1, the first core 18a is, for example, brought downward in the −Z direction from the +Z direction of the first bus bar 11 so that the first coupling wiring portion 11c of the first bus bar 11 illustrated in FIG. 6B is positioned in the opening 18d of the magnetic core 18.

Next, for example, the second core 18b is moved in the +Y direction from the −Y direction of the first bus bar 11. Then, the second core 18b is secured to the first core 18a at a position where the one end $18b_1$ of the second core 18b is in contact with the one end $18a_1$ of the first core 18a and the other end $18b_2$ of the second core 18b is in contact with the other end $18a_2$ of the first core 18a.

Next, for example, the third core 18c is moved in the +Y direction from the −Y direction of the first bus bar 11. Then, the third core 18c is secured to the first core 18a at a position where the one end $18c_1$ of the third core 18c is in contact with the one end $18a_1$ of the first core 18a and the other end $18c_2$ of the third core 18c is in contact with the other end $18a_2$ of the first core 18a.

At this time, in cross section $A_1$-$A_2$ illustrated in FIG. 3, as illustrated in FIG. 4, the second core 18b is positioned on the left side of the first lead conductor 12 in the drawing, and the third core 18c is located on the right side of the first lead conductor 12 in the drawing.

Next, the operation of the noise filter 1 illustrated in FIG. 2 will be described.

Figure 8A:
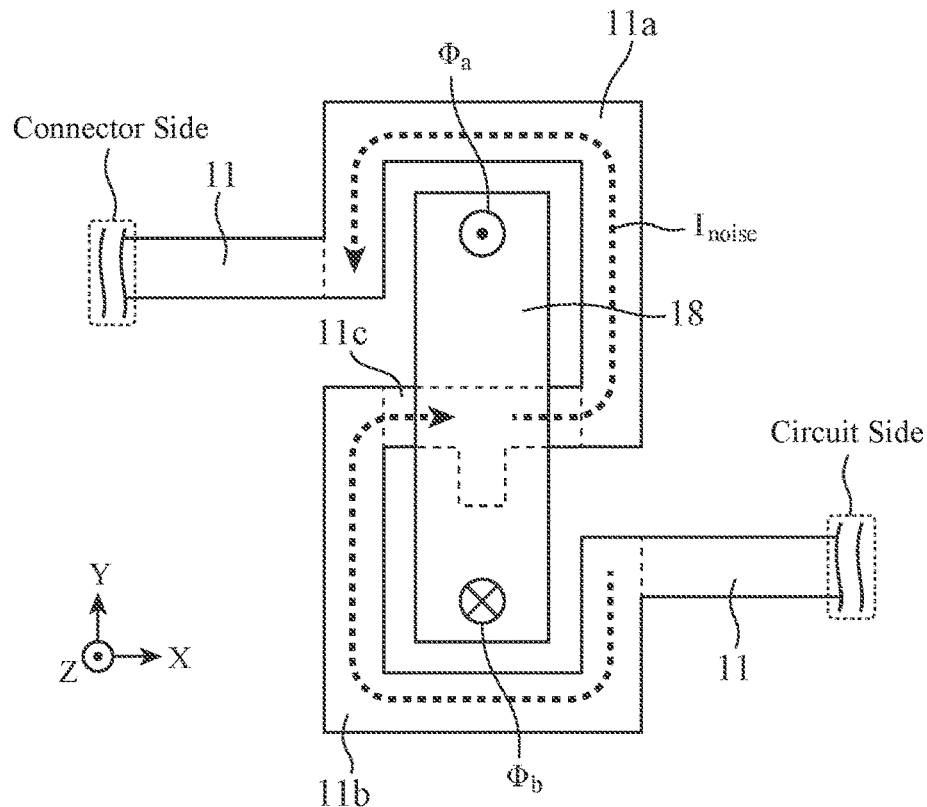
FIG. 8A is an explanatory diagram illustrating a noise current $I_{noise}$ flowing through the first bus bar 11.

FIG. 8A is an explanatory diagram illustrating noise current $I_{noise}$ flowing through the first bus bar 11.

Figure 8B:
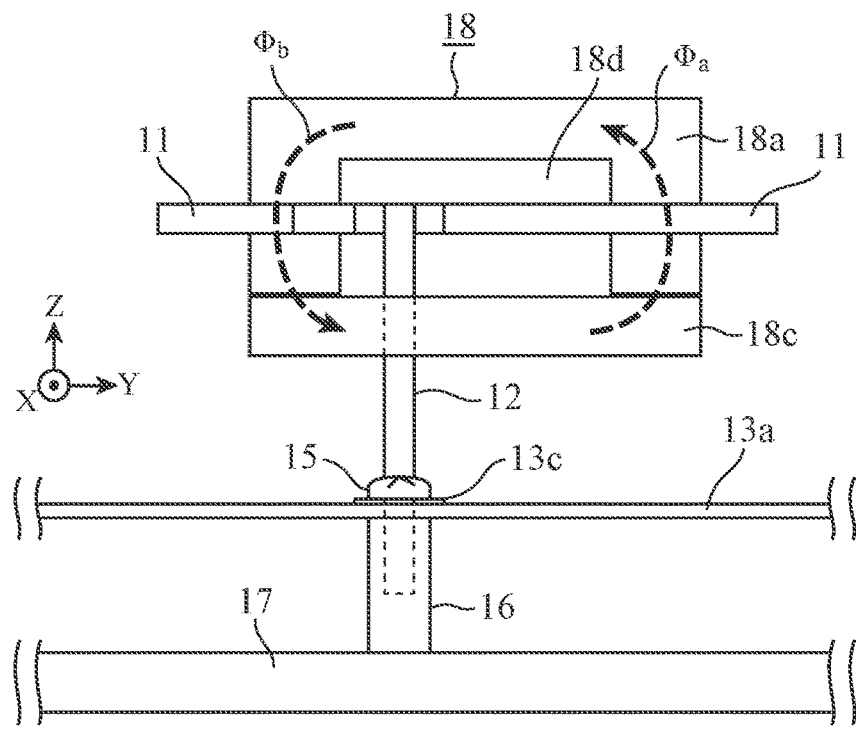
FIG. 8B is an explanatory diagram illustrating magnetic fluxes $\Phi_a$ and $\Phi_b$ generated by the noise current $I_{noise}$ flowing through the first bus bar 11.

FIG. 8B is an explanatory diagram illustrating magnetic fluxes $\Phi_a$ and $\Phi_b$ generated by the noise current $I_{noise}$ flowing through the first bus bar 11.

Figure 9:
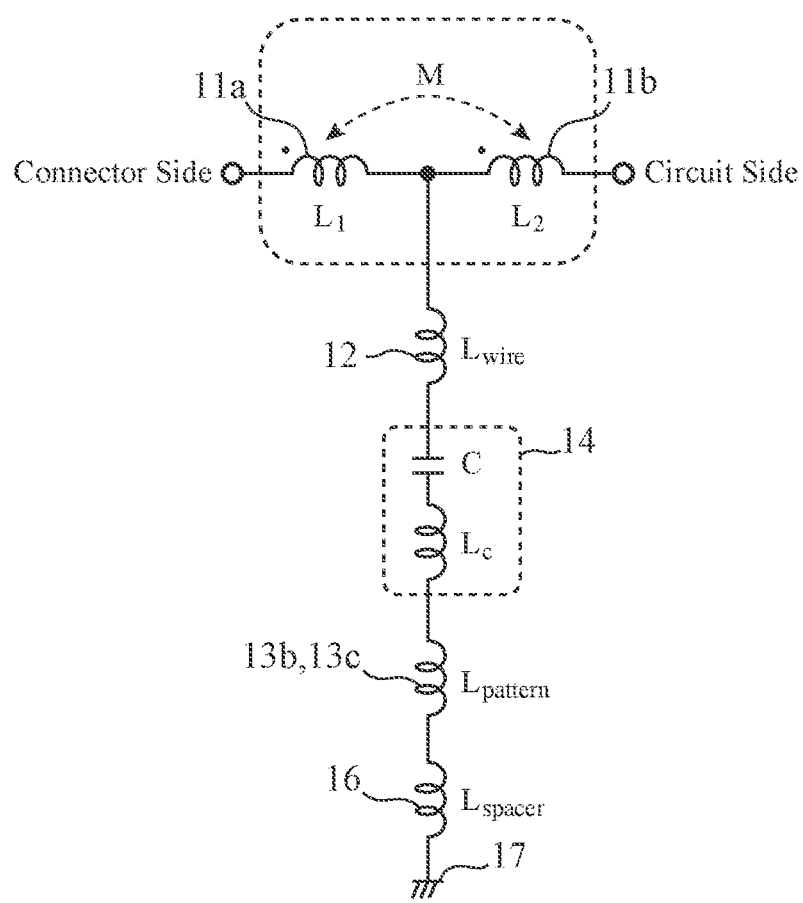
FIG. 9 is an equivalent circuit of the noise filter 1 illustrated in FIG. 2.

The first extending wiring portion 11a of the first bus bar 11 extends clockwise and forms a reactor $L_1$ as illustrated in FIG. 9.

The second extending wiring portion 11b of the first bus bar 11 extends counterclockwise and forms a reactor $L_2$ as illustrated in FIG. 9.

In FIG. 8A, an example is illustrated in which the noise current $I_{noise}$ flows through the first bus bar 11 from the circuit side toward the connector side.

As the noise current $I_{noise}$ flows through the first bus bar 11 from the circuit side toward the connector side, a magnetic flux $\Phi_a$ directed in the +Z direction is generated in the magnetic core 18 present inside the reactor $L_1$ formed by the first extending wiring portion 11a as illustrated in FIG. 8A.

In addition, as the noise current $I_{noise}$ flows through the first bus bar 11 from the circuit side toward the connector side, a magnetic flux $\Phi_b$ directed in the −Z direction is generated in the magnetic core 18 present inside the reactor $L_2$ formed by the second extending wiring portion 11b as illustrated in FIG. 8A.

At this point, in the magnetic core 18, the directions in which the magnetic flux $\Phi_a$ and the magnetic flux $\Phi_b$ are directed are the same as illustrated in FIG. 8B, and the magnetic flux $\Phi_a$ and the magnetic flux $\Phi_b$ intensify each other.

Since the magnetic flux $\Phi_a$ and the magnetic flux $\Phi_b$ share a magnetic path, there is a mutual inductance M between the reactor $L_1$ and the reactor $L_2$.

FIG. 9 is an equivalent circuit of the noise filter 1 illustrated in FIG. 2.

In FIG. 9, $L_{wire}$ denotes an inductance component of the first lead conductor 12, C denotes a capacitance of the first capacitor 14, $L_c$ denotes an inductance component of the first capacitor 14, and $L_{pattern}$ denotes a sum of an inductance component of the wiring pattern 13b and an inductance component of the ground pattern 13c.

$L_{spacer}$ denotes an inductance component of the spacer 16, and M denotes a mutual inductance between the reactor $L_1$ and the reactor $L_2$.

Figure 10:
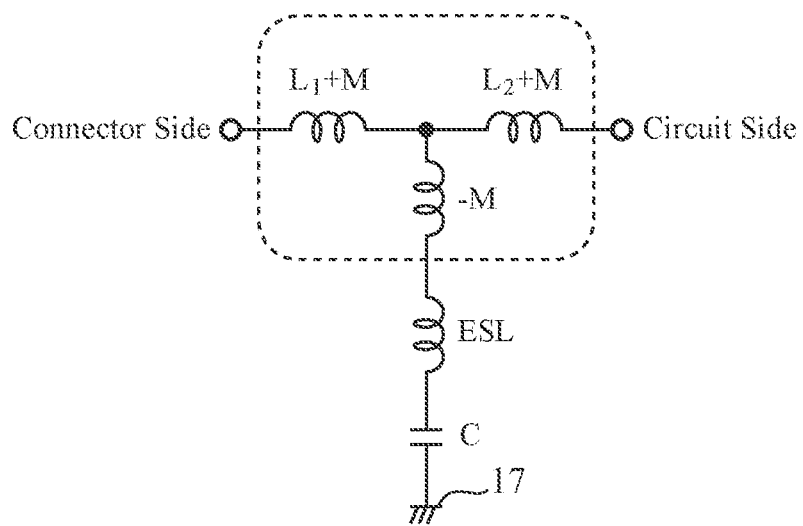
FIG. 10 is a diagram illustrating a circuit obtained by converting the equivalent circuit illustrated in FIG. 9 into an equivalent circuit.

FIG. 10 is a diagram illustrating a circuit obtained by converting the equivalent circuit illustrated in FIG. 9 into an equivalent circuit.

In FIG. 10, ESL denotes the sum of the inductance component $L_{wire}$, the inductance component $L_c$, the inductance component $L_{pattern}$, and the inductance component $L_{spacer}$.

In the noise filter 1 illustrated in FIG. 2, as illustrated in FIG. 10, ESL is connected in series with the capacitance C of the first capacitor 14, and an inductance component of −M is connected in series with the capacitance C.

An inductance component in which ESL and the inductance component of −M are connected in series is expressed as ESL−M. Therefore, in the noise filter 1 illustrated in FIG. 2, ESL can be canceled by the amount of the mutual inductance M.

In a case where there is inductance, the impedance generally increases as the frequency increases. Therefore, also in a case where the ESL illustrated in FIG. 10 is present, the impedance increases as the frequency increases.

Accordingly, ESL illustrated in FIG. 10 acts to prevent the noise current $I_{noise}$ of a high frequency flowing through the first bus bar 11 from flowing through the housing 17. Since ESL acts to prevent the noise current $I_{noise}$ from flowing through the housing 17, ESL deteriorates the effect of suppressing the high frequency noise.

In the noise filter 1 illustrated in FIG. 2, since ESL can be canceled by the amount of mutual inductance M, the effect of suppressing high frequency noise can be improved by the amount of mutual inductance M.

In the noise filter 1 illustrated in FIG. 2, the effect of suppressing the high frequency noise is optimized by determining the dimension of each of the first extending wiring portion 11a, the second extending wiring portion 11b, and the first coupling wiring portion 11c, the magnetic material of the magnetic core 18, and the dimension of the magnetic core 18 so as to obtain the mutual inductance M that satisfies ESL−M=0. The dimension of each of the first extending wiring portion 11a, the second extending wiring portion 11b, and the first coupling wiring portion 11c are mainly the inner diameter of the reactor $L_1$ and the inner diameter of the reactor $L_2$.

The value of ESL to be canceled can be obtained by performing electromagnetic field analysis or the like based on the respective structures of the first lead conductor 12, the wiring pattern 13b, and the spacer 16.

Therefore, it is important to select the dimensions and the magnetic material that allows the mutual inductance M to be as close to ESL as possible by performing electromagnetic field analysis or the like.

Figure 11:
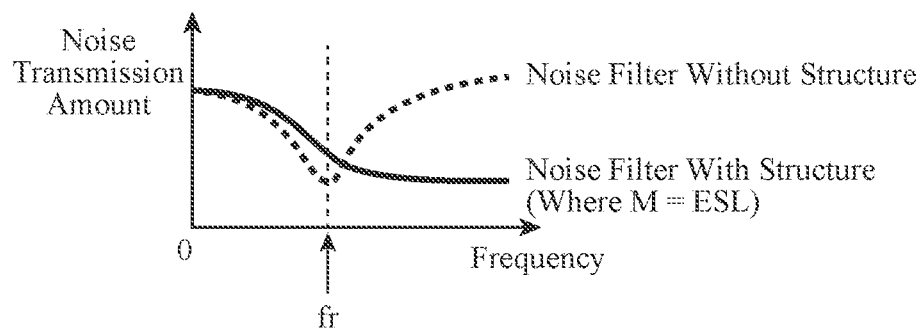
FIG. 11 is an explanatory diagram illustrating a noise suppression effect of the noise filter 1 according to the first embodiment.

FIG. 11 is an explanatory diagram illustrating a noise suppression effect of the noise filter 1 according to the first embodiment.

In the graph illustrated in FIG. 11, the horizontal axis represents the frequency, and the vertical axis represents the noise transmission amount between the circuit side and the connector side. As the noise transmission amount is lower, the noise suppression effect of the noise filter 1 is higher.

In FIG. 11, a noise filter "with structure" corresponds to the noise filter 1 illustrated in FIG. 2 whose dimensions and the like are determined so that M=ESL holds.

Figure 12:
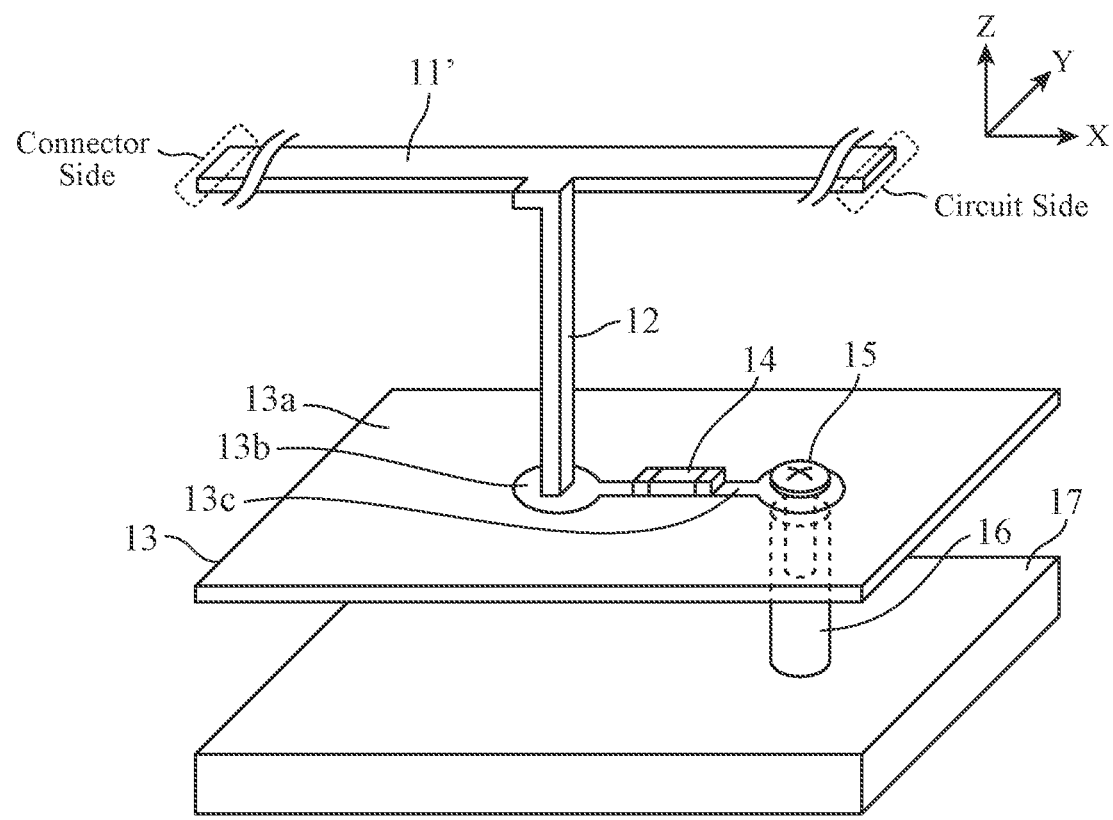
FIG. 12 is a perspective view illustrating a noise filter in which a linear bus bar 11' is used instead of the first bus bar 11 and the magnetic core 18 is not disposed.

As illustrated in FIG. 12, the "no structure" noise filter is a noise filter having a structure in which a linear bus bar 11' is used instead of the first bus bar 11 and the magnetic core 18 is not disposed.

FIG. 12 is a perspective view illustrating a noise filter in which the linear bus bar 11' is used instead of the first bus bar 11 and the magnetic core 18 is not disposed.

Around a frequency fr that is determined by the values of ESL and the capacitance C of the first capacitor 14, a noise filter "without structure" has a higher noise suppression effect than the noise filter "with structure".

However, at frequencies higher than the frequency fr to some extent, the noise suppression effect of the noise filter "without structure" decreases. Therefore, at frequencies higher than the frequency fr to some extent, the noise suppression effect is higher in the noise filter "with structure" than in the noise filter "without structure".

Note that, even if the mutual inductance M of the noise filter "with structure" does not match ESL, if the noise filter "with structure" has the mutual inductance M satisfying 0<M<2×ESL, the noise suppression effect becomes higher at frequencies higher than the frequency fr to some extent than that of the noise filter "without structure". The noise transmission amount at a frequency higher than the frequency fr to some extent is between the noise transmission amount of the noise filter "without structure" and the noise transmission amount of the noise filter in which M=ESL holds.

In the first embodiment described above, the noise filter 1 includes: the first bus bar 11 that is electrical wiring of a flat plate, the first bus bar 11 including the first extending wiring portion 11a extending in the first direction, the second extending wiring portion 11b extending in the second direction that is a direction opposite to the first direction, and the first coupling wiring portion 11c connecting the first extending wiring portion 11a and the second extending wiring portion 11b; the first lead conductor 12 having the one end connected with the first coupling wiring portion 11c; the first capacitor 14 having the one end connected with the other end of the first lead conductor 12 and the other end connected with the ground; and the magnetic core 18 having the opening 18d in the central portion, the magnetic core 18 disposed in such a manner that the first coupling wiring portion 11c passes through the opening 18d. Therefore, it is possible to implement the noise filter 1 using the first bus bar 11 having a planar structure that can be manufactured by punching, pressing, or the like.

In the noise filter 1 illustrated in FIG. 2, the first extending wiring portion 11a extends clockwise, and the second extending wiring portion 11b extends counterclockwise.

In order to obtain a desired magnetic flux $\Phi_a$, it is sufficient that the portion of the first bus bar 11 having the first extending wiring portion 11a and the first coupling wiring portion 11c circumferentially surrounds the magnetic core 18 by about three quarters or more. In addition, in order to obtain a desired magnetic flux $\Phi_b$, it is sufficient that the portion of the first bus bar 11 having the second extending wiring portion 11b and the first coupling wiring portion 11c circumferentially surrounds the magnetic core 18 by about three quarters or more.

Figure 13:
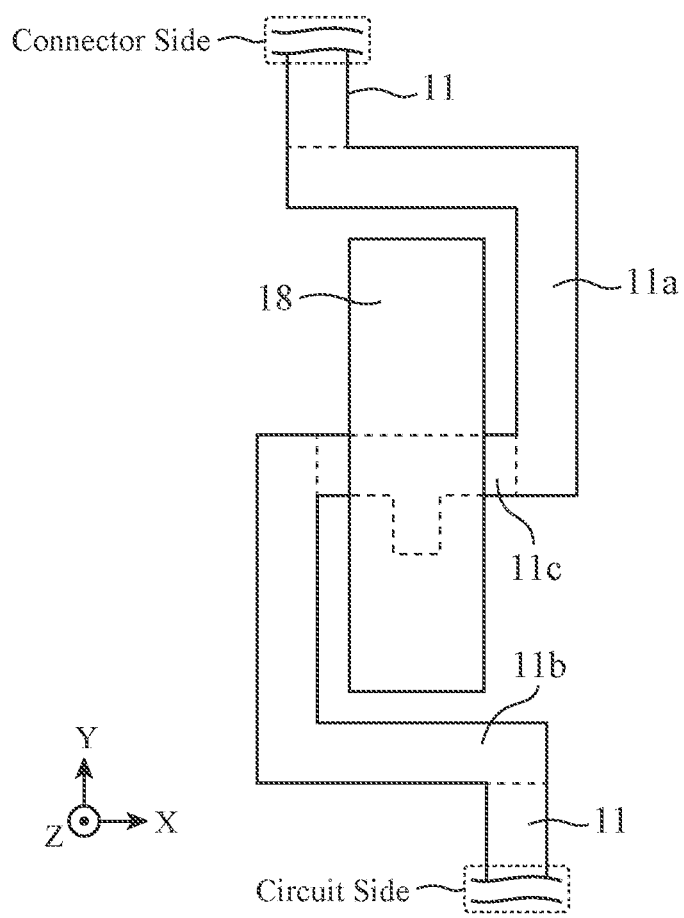
FIG. 13 is an explanatory diagram illustrating an example in which a portion having a first extending wiring portion 11a and a first coupling wiring portion 11c circumferentially surrounds the magnetic core 18 by three quarters, and a portion having a second extending wiring portion 11b and the first coupling wiring portion 11c circumferentially surrounds the magnetic core 18 by three quarters.

FIG. 13 is an explanatory diagram illustrating an example in which a portion having the first extending wiring portion 11a and the first coupling wiring portion 11c circumferentially surrounds the magnetic core 18 by three quarters, and a portion having the second extending wiring portion 11b and the first coupling wiring portion 11c circumferentially surrounds the magnetic core 18 by three quarters.

In the noise filter 1 illustrated in FIG. 2, the one end of the first bus bar 11 is connected with the connector, and the other end of the first bus bar 11 is connected with the motor driving circuit. However, this is merely an example, and the one end of the first bus bar 11 may be connected with the motor driving circuit, and the other end of the first bus bar 11 may be connected with the connector.

In the noise filter 1 illustrated in FIG. 2, the first bus bar 11 and the first lead conductor 12 are integrally formed, and then the first lead conductor 12 is bent at the bent portion 19.

However, this is merely an example, and for example, a cable may be used as the first lead conductor 12, and one end of the cable may be connected with the first coupling wiring portion 11c, and the other end of the cable may be connected with the wiring pattern 13b.

The connection between the one end of the cable and the first coupling wiring portion 11c and the connection between the other end of the cable and the wiring pattern 13b may be each achieved by soldering or screwing. Alternatively, the connection between the one end of the cable and the first coupling wiring portion 11c may be achieved by soldering, and the connection between the other end of the cable and the wiring pattern 13b may be achieved by screwing, or the connection between one end of the cable and the first coupling wiring portion 11c may be achieved by screwing, and the connection between the other end of the cable and the wiring pattern 13b may be achieved by soldering.

Furthermore, as the first lead conductor 12, for example, a conductive material having a spring property may be used.

Note that the first lead conductor 12 and the wiring pattern 13b only need to be electrically connected, and the connection may be achieved by screwing, contact by a conductive material having a spring property, adhesion by a conductive adhesive, welding, or the like.

In the noise filter 1 illustrated in FIG. 2, each of the first core 18a, the second core 18b, and the third core 18c is made of a magnetic material. Each of the first core 18a, the second core 18b, and the third core 18c only needs to be a magnetic body and may be made of iron, ferrite, an amorphous-based alloy, or the like.

In the noise filter 1 illustrated in FIG. 2, the second core 18b and the third core 18c are each secured to the first core 18a at the time of assembly.

However, it is sufficient that the magnetic core 18 can be disposed in such a manner that the first coupling wiring portion 11c passes through the opening 18d, and the first core 18a, the second core 18b, and the third core 18c may be integrally molded in whole or in part.

In the noise filter 1 illustrated in FIG. 2, the first core 18a is formed by molding into a three-sided frame shape, and each of the second core 18b and the third core 18c is molded in a rectangular column shape.

However, it is sufficient that the magnetic core 18 can be disposed in such a manner that the first coupling wiring portion 11c passes through the opening 18d, and the first core 18a may have, for example, a curved shape, and the second core 18b and the third core 18c may each have, for example, a curved shape.

In the noise filter 1 illustrated in FIG. 2, each of the first core 18a, the second core 18b, and the third core 18c is held by some member. At this time, it is sufficient that the magnetic core 18 can be disposed in such a manner that the first coupling wiring portion 11c passes through the opening 18d, and it is assumed that each of the first core 18a, the second core 18b, and the third core 18c is held by a non-conductive member such as resin.

Specifically, it is assumed that each of the first core 18a, the second core 18b, and the third core 18c is held by a non-conductive support member having one end secured to the first bus bar 11.

In the noise filter 1 illustrated in FIG. 2, each of the wiring pattern 13b and the ground pattern 13c is formed on the printed board 13.

However, this is merely an example, and the printed board 13 may be a multilayer substrate, and the wiring pattern 13b and the ground pattern 13c may be formed on different layers of the multilayer substrate.

In the noise filter 1 illustrated in FIG. 2, the first capacitor 14 is mounted on the printed board 13. The first capacitor 14 only needs to have the capacitance C and may be a surface-mounting-type capacitor or a lead-type capacitor.

In the noise filter 1 illustrated in FIG. 2, the screw 15 electrically connects the ground pattern 13c and the spacer. However, this is merely an example, and the ground pattern 13c and the spacer may be electrically connected by soldering, welding, or fitting by a spring member.

In the noise filter 1 illustrated in FIG. 2, the spacer 16 electrically connects the ground pattern 13c and the housing 17. However, this is merely an example, and the housing 17 may be formed into a spacer shape, and the housing 17 formed in the spacer shape may be electrically connected with the ground pattern 13c.

In the noise filter 1 illustrated in FIG. 2, the spacer 16 is connected with the housing 17 connected with the ground (not illustrated). However, this is merely an example, and the spacer 16 may be connected with the ground (not illustrated).

Second Embodiment

In a second embodiment, a noise filter 1 including a first bus bar 11 and a second bus bar 21 will be described.

Figure 14:
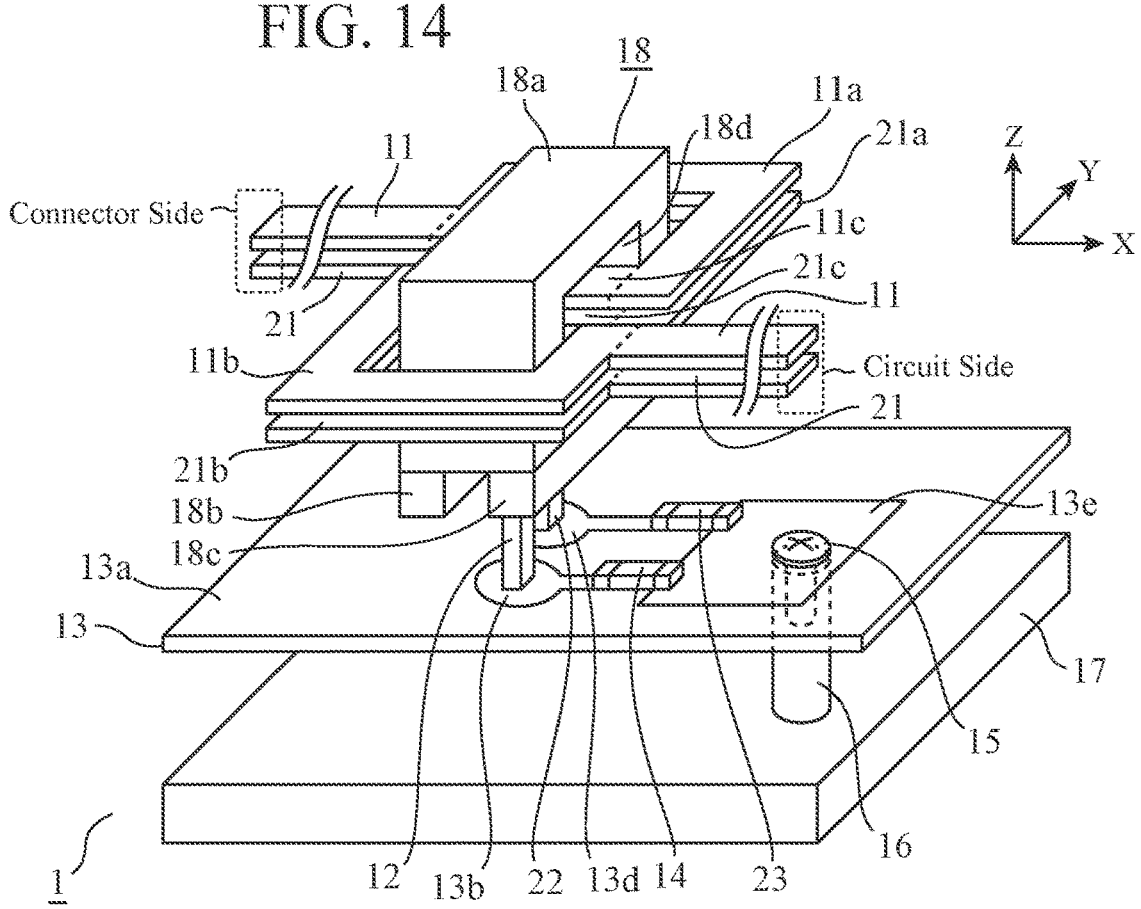
FIG. 14 is a perspective view illustrating a noise filter 1 according to a second embodiment.

FIG. 14 is a perspective view illustrating the noise filter 1 according to the second embodiment.

Figure 15:
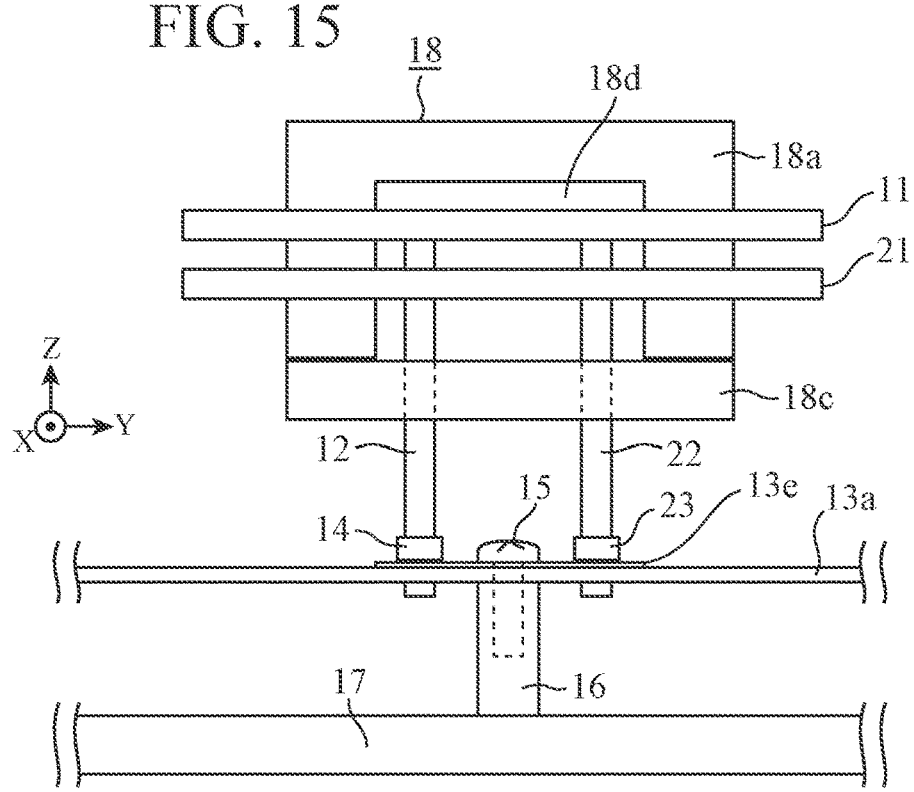
FIG. 15 is a Y-Z plane view of the noise filter 1 illustrated in FIG. 14 as viewed from +X direction.

FIG. 15 is a Y-Z plane view of the noise filter 1 illustrated in FIG. 14 as viewed from +X direction.

In FIGS. 14 and 15, the same symbol as that in FIGS. 2 to 6 represents the same or a corresponding part, and thus description thereof is omitted.

A second bus bar 21 is installed on an X-Y plane.

The second bus bar 21 is electrical wiring of a flat plate having the same shape as that of the first bus bar 11. Here, the same shape is not limited to shapes that are exactly the same, and the shapes of the first bus bar 11 and the second bus bar 21 may be different in a range where there is no practical problem.

The one end of the second bus bar 21 is connected with, for example, a connector connected with a voltage output terminal of an electrode in a DC power supply, and the other end of the second bus bar 21 is connected with, for example, a motor driving circuit.

In the noise filter 1 illustrated in FIG. 14, the one end of the first bus bar 11 is connected with, for example, a connector connected with a voltage output terminal of a +electrode in a DC power supply.

The first bus bar 11 and the second bus bar 21 are arranged in parallel with each other in a state where electrical insulation is maintained. Note that, the arrangement of the first bus bar 11 and the second bus bar 21 is not limited to being strictly parallel and may be substantially parallel in a range where there is no practical problem.

The second bus bar 21 includes a third extending wiring portion 21a extending in a first direction and a fourth extending wiring portion 21b extending in a second direction.

The first direction is a clockwise direction starting from the side connected with the connector when the second bus bar 21 is viewed from the +Z direction. The second direction is a counterclockwise direction starting from the side connected with the connector when the second bus bar 21 is viewed from the +Z direction.

In addition, the second bus bar 21 includes a second coupling wiring portion 21c connecting the third extending wiring portion 21a and the fourth extending wiring portion 21b.

In the noise filter 1 illustrated in FIG. 14, the third extending wiring portion 21a, the fourth extending wiring portion 21b, and the second coupling wiring portion 21c are integrally formed.

In the noise filter 1 illustrated in FIG. 14, the first direction is the clockwise direction, and the second direction is the counterclockwise direction. However, this is merely an example, and the first direction may be the counterclockwise direction, and the second direction may be the clockwise direction. That is, the first bus bar 11 may have a first extending wiring portion 11a extending counterclockwise and a second extending wiring portion 11b extending clockwise, and the second bus bar 21 may have a third extending wiring portion 21a extending counterclockwise and a fourth extending wiring portion 21b extending clockwise.

A second lead conductor 22 is electrical wiring of a flat plate having one end connected with the second coupling wiring portion 21c and the other end connected with a wiring pattern 13d formed on the printed board 13.

The second lead conductor 22 is manufactured in a similar manner to that of the first lead conductor 12.

The first capacitor 14 and the second capacitor 23 are each mounted on the printed board 13.

The wiring pattern 13d is conductive electric wiring and is connected with each of the other end of the second lead conductor 22 and one end of the second capacitor 23.

A ground pattern 13e is conductive electric wiring and is connected with each of the other end of the first capacitor 14 and the other end of the second capacitor 23.

The one end of the second capacitor 23 is connected with the other end of the second lead conductor 22 via the wiring pattern 13d.

The other end of the second capacitor 23 is connected with the ground pattern 13e.

A magnetic core 18 is disposed in such a manner that each of the first coupling wiring portion 11c and the second coupling wiring portion 21c passes through an opening 18d.

Figure 16:
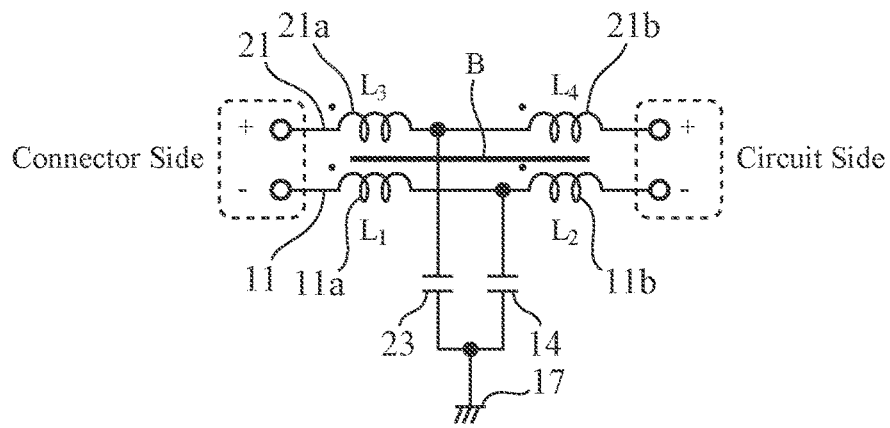
FIG. 16 is an equivalent circuit of the noise filter 1 illustrated in FIG. 14.

FIG. 16 is an equivalent circuit of the noise filter 1 illustrated in FIG. 14. In FIG. 16, ESL and mutual inductance M are omitted for simplicity of description.

The third extending wiring portion 21a of the second bus bar 21 extends clockwise and forms a reactor $L_3$.

The fourth extending wiring portion 21b of the second bus bar 21 extends counterclockwise and forms a reactor $L_4$.

In FIG. 16, a solid line indicated by B indicates that the reactors $L_1$ and $L_2$ and the reactors $L_3$ and $L_4$ are magnetically coupled by the magnetic core 18.

Next, the operation of the noise filter 1 illustrated in FIG. 14 will be described.

As the noise current that flows through each of the first bus bar 11 and the second bus bar 21, there are a normal mode current and a common mode current.

In the normal mode current, the direction in which the current flows through the first bus bar 11 is opposite to the direction in which the current flows through the second bus bar 21.

In the common mode current, the direction in which the current flows through the first bus bar 11 is the same as the direction in which the current flows through the second bus bar 21.

In both the normal mode current and the common mode current, the amount of a current flowing through the first bus bar 11 is the same as the amount of a current flowing through the second bus bar 21.

In a device using a bus bar such as an inverter device for driving a motor, a normal mode current is often a large current greater than or equal to several tens of amperes. When a magnetic flux generated by a large current greater than or equal to several tens of amperes passes through the magnetic body, the magnetic body may cause magnetic saturation. In the state of magnetic saturation, the relative permeability of the magnetic body is close to 1, and the magnetic body almost does not serve as a core.

In the noise filter 1 illustrated in FIG. 14, even when a normal mode current flows through each of the first bus bar 11 and the second bus bar 21, the current flowing through the first bus bar 11 and the current flowing through the second bus bar 21 have the same amount in opposite directions.

Since the current flowing through the first bus bar 11 and the current flowing through the second bus bar 21 have the same amount in opposite directions, the magnetic flux $\Phi_a$ generated by the normal mode current flowing through the first bus bar 11 and the magnetic flux $\Phi_a'$ generated by the normal mode current flowing through the second bus bar 21 cancel each other. In addition, the magnetic flux $\Phi_b$ generated by the normal mode current flowing through the first bus bar 11 and the magnetic flux $\Phi_b'$ generated by the normal mode current flowing through the second bus bar 21 cancel each other.

Therefore, in the noise filter 1 illustrated in FIG. 14, even if the normal mode current flows through each of the first bus bar 11 and the second bus bar 21, the magnetic core 18 hardly causes magnetic saturation.

In the common mode current, as described above, the current flowing through the first bus bar 11 and the current flowing through the second bus bar 21 have the same direction and the same amount.

Therefore, magnetic flux $\Phi_a$ generated by the common mode current flowing through the first bus bar 11 and magnetic flux $\Phi_a'$ generated by the common mode current flowing through the second bus bar 21 do not cancel each other. Likewise, the magnetic flux $\Phi_b$ generated by the common mode current flowing through the first bus bar 11 and the magnetic flux $\Phi_b'$ generated by the common mode current flowing through the second bus bar 21 do not cancel each other.

When the common mode current flows through each of the first bus bar 11 and the second bus bar 21, the magnetic flux $\Phi_a$ and the magnetic flux $\Phi_a'$ are not canceled, and the magnetic flux $\Phi_b$ and the magnetic flux $\Phi_b'$ are not canceled either, and thus the mutual inductance M is generated.

In the noise filter 1 illustrated in FIG. 14, the mutual inductance M is used to cancel ESL that is a factor of deteriorating the effect of suppressing high frequency noise (hereinafter, referred to as "common mode noise") due to the common mode current.

In the noise filter 1 illustrated in FIG. 14, the dimensions of the first extending wiring portion 11a, the second extending wiring portion 11b, and the first coupling wiring portion 11c are determined so that the mutual inductance M satisfying ESL−M=0 is obtained. In addition, the dimensions of the third extending wiring portion 21a, the fourth extending wiring portion 21b, and the second coupling wiring portion 21c, the magnetic material of the magnetic core 18, and the dimensions of the magnetic core 18 are determined.

As described above, by determining the dimensions and the magnetic material, the effect of suppressing the common mode noise is optimized.

The dimension of each of the first extending wiring portion 11a, the second extending wiring portion 11b, and the first coupling wiring portion 11c are mainly the inner diameter of the reactor $L_1$ and the inner diameter of the reactor $L_2$. The dimension of each of the third extending wiring portion 21a, the fourth extending wiring portion 21b, and the second coupling wiring portion 21c are mainly the inner diameter of the reactor $L_3$ and the inner diameter of the reactor $L_4$.

Note that the value of ESL to be canceled can be obtained by performing electromagnetic field analysis or the like based on the respective structures of the first lead conductor 12, the second lead conductor 22, the wiring patterns 13b and 13d, and the spacer 16.

Therefore, it is important to select the dimensions and the magnetic material that allows the mutual inductance M to be as close to ESL as possible by performing electromagnetic field analysis or the like.

Figure 17:
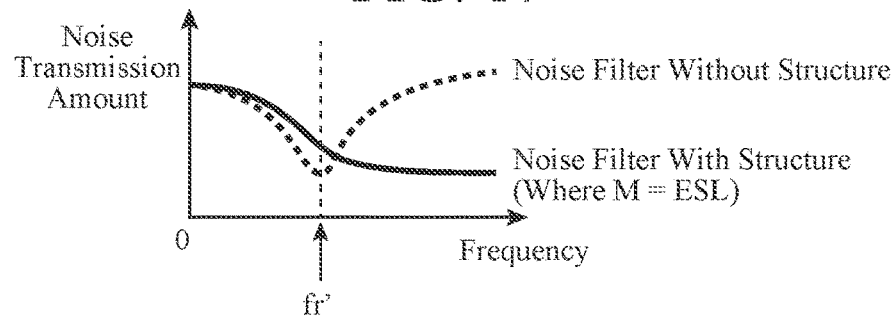
FIG. 17 is an explanatory diagram illustrating a noise suppression effect of the noise filter 1 according to the second embodiment.

FIG. 17 is an explanatory diagram illustrating a noise reduction effect of the noise filter 1 according to the second embodiment.

In the graph illustrated in FIG. 17, the horizontal axis represents the frequency, and the vertical axis represents the noise transmission amount between the circuit side and the connector side. As the noise transmission amount is lower, the noise suppression effect of the noise filter 1 is higher.

In FIG. 17, a noise filter "with structure" corresponds to the noise filter 1 illustrated in FIG. 14 whose dimensions and the like are determined so that M=ESL holds.

Figure 18:
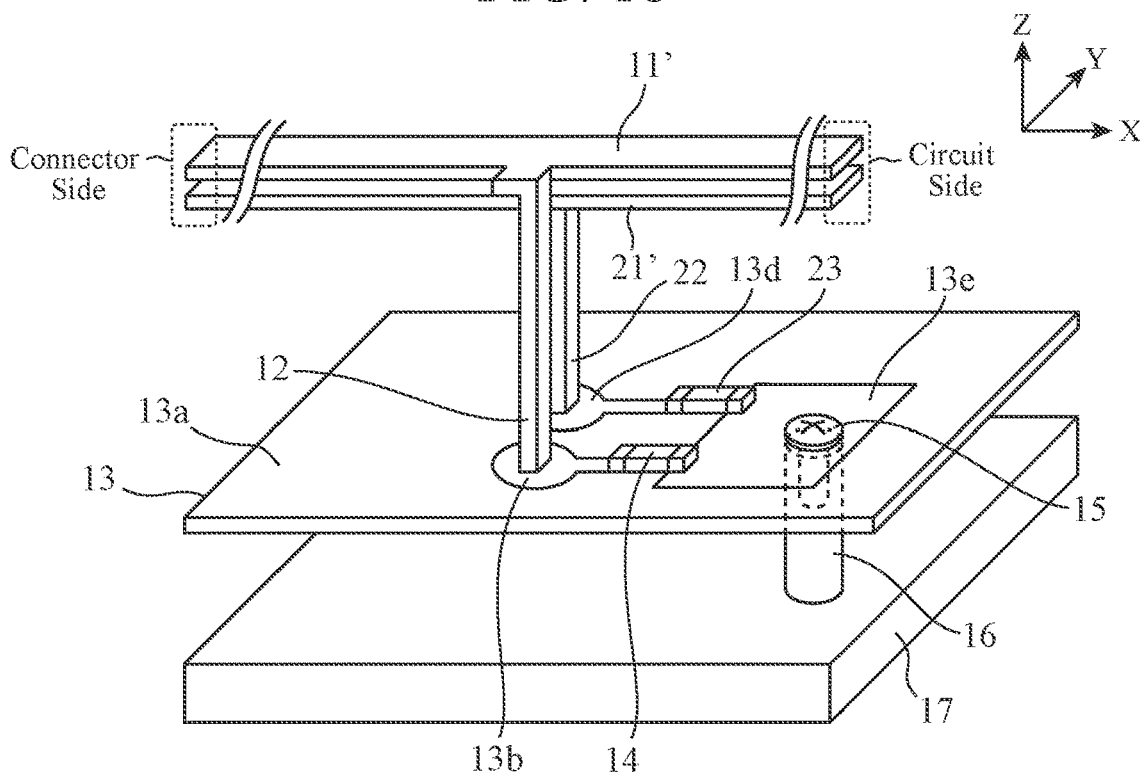
FIG. 18 is a perspective view illustrating a noise filter in which the linear bus bar 11' is used instead of the first bus bar 11, a linear bus bar 21' is used instead of the second bus bar 21, and the magnetic core 18 is not disposed.

As illustrated in FIG. 18, the noise filter "without structure" has a structure in which the linear bus bar 11' is used instead of the first bus bar 11, the linear bus bar 21' is used instead of the second bus bar 21, and the magnetic core 18 is not disposed.

FIG. 18 is a perspective view illustrating the noise filter in which the linear bus bar 11' is used instead of the first bus bar 11, the linear bus bar 21' is used instead of the second bus bar 21, and the magnetic core 18 is not disposed.

Around a frequency fr' that is determined by the values of ESL, the capacitance C of the first capacitor 14, and the capacitance C of the second capacitor 23, a noise filter "without structure" has a higher noise suppression effect than the noise filter "with structure".

However, at frequencies higher than the frequency fr' to some extent, the noise suppression effect of the noise filter "without structure" decreases. Therefore, at frequencies higher than the frequency fr' to some extent, the noise suppression effect is higher in the noise filter "with structure" than in the noise filter "without structure".

Note that, even if the mutual inductance M of the noise filter "with structure" does not match ESL, if the noise filter "with structure" has the mutual inductance M satisfying 0<M<2×ESL, the noise suppression effect becomes higher at frequencies higher than the frequency fr' to some extent than that of the noise filter "without structure". The noise transmission amount at a frequency higher than the frequency fr' to some extent is between the noise transmission amount of the noise filter "without structure" and the noise transmission amount of the noise filter in which M=ESL holds.

In the second embodiment described above, the noise filter 1 includes: the second bus bar 21 that is electrical wiring of a flat plate shape same as that of the first bus bar 11, the second bus bar 21 including the third extending wiring portion 21a extending in the first direction, the fourth extending wiring portion 21b extending in the second direction that is a direction opposite to the first direction, and the second coupling wiring portion 21c connecting the third extending wiring portion 21a and the fourth extending wiring portion 21b; the second lead conductor 22 having the one end connected with the second coupling wiring portion 21c; and the second capacitor 23 having the one end connected with the other end of the second lead conductor 22 and the other end connected with the ground. In addition, in the noise filter 1, the first bus bar 11 and the second bus bar 21 are arranged in parallel with each other in a state where electrical insulation is maintained, and the magnetic core 18 is disposed in such a manner that the first coupling wiring portion 11c and the second coupling wiring portion 21c each pass through the opening 18d. Therefore, it is possible to implement the noise filter 1 using each of the first bus bar 11 and the second bus bar 21 having a planar structure that can be manufactured by punching, pressing, or the like. Furthermore, the noise filter 1 can prevent occurrence of magnetic saturation due to the normal mode current.

In the noise filter 1 illustrated in FIG. 14, the first extending wiring portion 11a extends clockwise, and the second extending wiring portion 11b extends counterclockwise. Moreover, the third extending wiring portion 21a extends clockwise, and the fourth extending wiring portion 21b extends counterclockwise.

In order to obtain a desired magnetic flux $\Phi_a$, it is sufficient that the portion of the first bus bar 11 having the first extending wiring portion 11a and the first coupling wiring portion 11c circumferentially surrounds the magnetic core 18 by about three quarters or more. In addition, in order to obtain a desired magnetic flux $\Phi_b$, it is sufficient that the portion of the first bus bar 11 having the second extending wiring portion 11b and the first coupling wiring portion 11c circumferentially surrounds the magnetic core 18 by about three quarters or more.

In order to obtain a desired magnetic flux $\Phi_a'$, it is sufficient that the portion of the second bus bar 21 having the third extending wiring portion 21a and the second coupling wiring portion 21c circumferentially surrounds the magnetic core 18 by about three quarters or more. In addition, in order to obtain a desired magnetic flux $\Phi_b'$, it is sufficient that the portion of the second bus bar 21 having the fourth extending wiring portion 21b and the second coupling wiring portion 21c circumferentially surrounds the magnetic core 18 by about three quarters or more.

In the noise filter 1 illustrated in FIG. 14, the one end of the first bus bar 11 is connected with the connector connected with the voltage output terminal of the +electrode in the DC power supply, and the one end of the second bus bar 21 is connected with the connector connected with the voltage output terminal of the −electrode in the DC power supply. However, this is merely an example, and the one end of the first bus bar 11 may be connected with a connector connected with a voltage output terminal of a −electrode in the DC power supply, and the one end of the second bus bar 21 may be connected with a connector connected with a voltage output terminal of a +electrode in the DC power supply.

Alternatively, the one end of the first bus bar 11 may be connected with a connector connected with one of two lines of a single-phase AC, and the one end of the second bus bar 21 may be connected with a connector connected with the other of the two lines of the single-phase AC.

Further alternatively, one end of each of a plurality of bus bars may be connected with one of three lines of three-phase alternating current or one of four lines of three-phase alternating current. In a case where the one end of each of the plurality of bus bars is connected with one of three lines of three-phase alternating current, there are three sets of a bus bar, a lead conductor, and a capacitor. Alternatively, in a case where the one end of each of the plurality of bus bars is connected with one of four lines of three-phase alternating current, there are four sets of a bus bar, a lead conductor, and a capacitor.

Third Embodiment

In a third embodiment, a noise filter 1 including a magnetic core 18 in which non-magnetic spacers 40 are inserted in a part of a magnetic body will be described.

Figure 19:
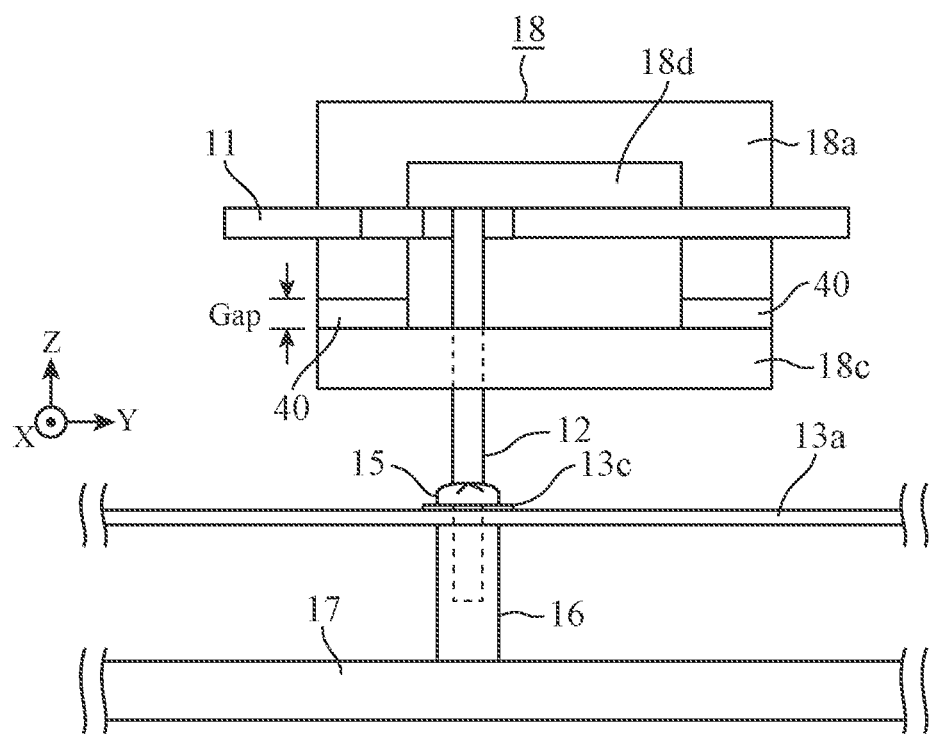
FIG. 19 is a Y-Z plane view of a noise filter 1 according to a third embodiment as viewed from +X direction.

FIG. 19 is a Y-Z plane view of the noise filter 1 according to the third embodiment as viewed from +X direction. In FIG. 19, the same symbol as that in FIGS. 2 and 5 represents the same or a corresponding part, and thus description thereof is omitted.

Spacers 40 are formed of a non-magnetic material.

A spacer 40 is sandwiched between the one end $18a_1$ of the first core 18a and each of the one end $18b_1$ of the second core 18b and the one end $18c_1$ of the third core 18c.

Likewise, a spacer 40 is sandwiched between the other end $18a_2$ of the first core 18a and each of the other end $18b_2$ of the second core 18b and the other end $18c_2$ of the third core 18c.

Note that the spacers 40 are only required to be a non-magnetic body and may be formed of resin or metal. Alternatively, the spacers 40 may be the air.

Next, the operation of the noise filter 1 illustrated in FIG. 19 will be described.

In the noise filter 1 illustrated in FIG. 2, the magnetic core 18 does not include the spacers 40, and no gap is formed between the first core 18a and each of the second core 18b and the third core 18c.

When there is no gap, as illustrated in FIG. 8B, there is almost no leakage of the magnetic flux $\Phi_a$ from the magnetic core 18 nor a leakage of the magnetic flux $\Phi_b$ from the magnetic core 18.

In the noise filter 1 illustrated in FIG. 19, the magnetic core 18 includes the spacers 40, and there are gaps between the first core 18a and each of the second core 18b and the third core 18c.

Since there are gaps, a part of the magnetic flux $\Phi_a$ leaks from the gap, and a part of the magnetic flux $\Phi_b$ leaks from the gap. Therefore, in a case where there are gaps, the magnetic coupling between the reactor $L_1$ and the reactor $L_2$ is weaker and the mutual inductance M decreases as compared with a case where there are no gaps.

In addition, the larger the size of the gaps is, the larger the reduction amount of the mutual inductance M is.

In the noise filter 1 illustrated in FIG. 19, the size of the gaps can be modified by adjusting the thickness of the spacers 40, thereby allowing the mutual inductance M to be adjusted.

Therefore, the thickness of the spacers 40 is one of adjustment parameters of the mutual inductance M when dimensions and a magnetic material that allows the mutual inductance M to be as close to ESL as possible are selected by performing electromagnetic field analysis or the like.

Figure 20A:
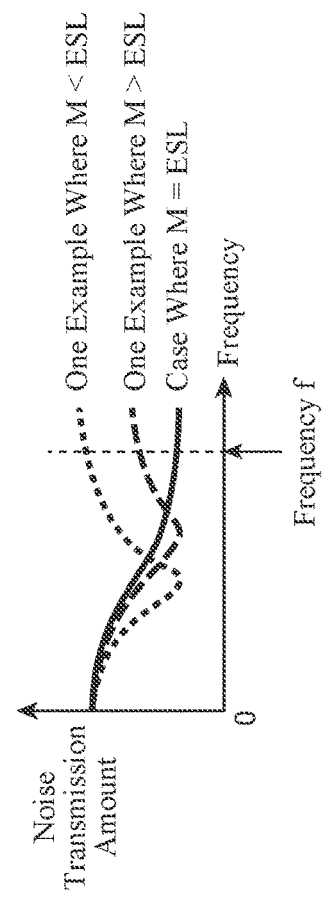
FIG. 20A is an explanatory graph illustrating a correspondence relationship between the size of gaps and a mutual inductance M.

FIG. 20A is an explanatory diagram illustrating a correspondence relationship between the size of the gaps and the mutual inductance M.

Figure 20B:
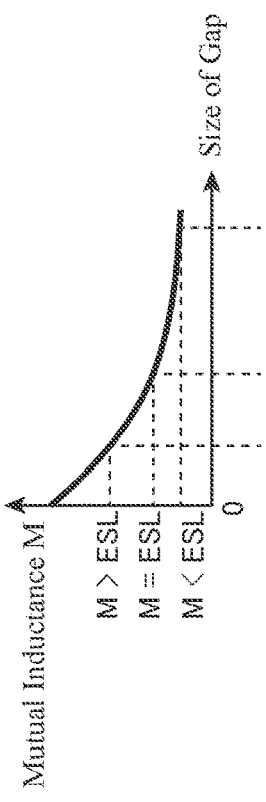
FIG. 20B is an explanatory graph illustrating a correspondence relationship between a frequency f and the noise transmission amount.

FIG. 20B is an explanatory graph illustrating a correspondence relationship between a frequency f and the noise transmission amount.

Figure 20C:
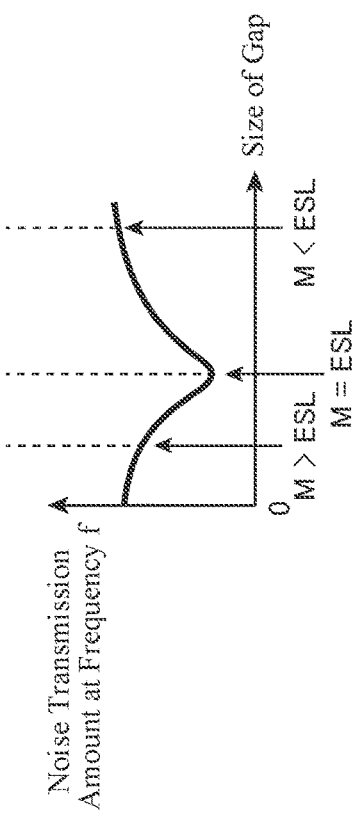
FIG. 20C is an explanatory graph illustrating a correspondence relationship between the size of a gap and the noise transmission amount at a frequency f.

FIG. 20C is an explanatory graph illustrating a correspondence relationship between the size of the gaps and the noise transmission amount at a frequency f.

As illustrated in FIG. 20A, the mutual inductance M decreases as the size of the gaps increases.

When the frequency of the noise current $I_{noise}$ is high and the frequency of the noise current $I_{noise}$ equals f, as illustrated in FIGS. 20B and 20C, the noise transmission amount decreases, and the noise suppression effect becomes higher in a case where M=ESL than cases where M<ESL and M>ESL.

In the third embodiment described above, the noise filter 1 illustrated in FIG. 19 includes the magnetic core 18 in which the spacer 40 of the non-magnetic body is inserted in a part of the magnetic body. Therefore, the noise filter 1 illustrated in FIG. 19 can be implemented using the first bus bar 11 having a planar structure that can be manufactured by punching, pressing, or the like, similarly to the noise filter 1 illustrated in FIG. 2. In addition, the noise filter 1 illustrated in FIG. 19 can adjust the noise suppression effect without changing the dimensions of the first bus bar 11 or the dimensions and the material of the magnetic core 18.

In the noise filter 1 illustrated in FIG. 19, the spacer 40 is sandwiched between the first core 18a and the second core 18b, and the spacer 40 is sandwiched between the first core 18a and the third core 18c.

However, this is merely an example, and the spacer 40 may be sandwiched only between the first core 18a and the second core 18b, or the spacer 40 may be sandwiched only between the first core 18a and the third core 18c.

Furthermore, the thickness of the spacer 40 sandwiched between the first core 18a and the second core 18b may be different from the thickness of the spacer 40 sandwiched between the first core 18a and the third core 18c.

Note that the present invention may include a flexible combination of the embodiments, a modification of any component of the embodiments, or an omission of any component in the embodiments within the scope of the present invention.

INDUSTRIAL APPLICABILITY

The present invention is suitable for a noise filter including a capacitor and a power supply device.

REFERENCE SIGNS LIST

1: noise filter, 11: first bus bar, 11a: first extending wiring portion, 11b: second extending wiring portion, 11c: first coupling wiring portion, 11': bus bar, 12: first lead conductor, 13: printed board, 13a: insulator, 13b: wiring pattern, 13c: ground pattern, 13d: wiring pattern, 13e: ground pattern, 14: first capacitor, 15: screw, 16: spacer, 17: housing, 18: magnetic core, 18a: first core, $18a_1$: one end, $18a_2$: other end, 18b: second core, $18b_1$: one end, $18b_2$: other end, 18c: third core, $18c_1$: one end, $18c_2$: other end, 18d: opening, 19: bent portion, 21: second bus bar, 21a: third extending wiring portion, 21b: fourth extending wiring portion, 21c: second coupling wiring portion, 21': bus bar, 22: second lead conductor, 23: second capacitor, 40: spacer

The invention claimed is:
1. A noise filter comprising:
a first bus bar that is electrical wiring of a flat plate, the first bus bar comprising a first extending wiring portion circumferentially extending in a first direction, a second extending wiring portion circumferentially extending in a second direction that is a direction opposite to the first direction, and a first coupling wiring portion connecting the first extending wiring portion and the second extending wiring portion;
a first lead conductor having a first end connected with the first coupling wiring portion;
a first capacitor having a first end connected with a second end of the first lead conductor and a second end connected with a ground; and
a magnetic core having an opening in a central portion, the magnetic core disposed in such a manner that the first coupling wiring portion passes through the opening.

2. The noise filter according to claim 1, further comprising:
a second bus bar that is electrical wiring of a flat plate shape same as that of the first bus bar, the second bus bar comprising a third extending wiring portion extending in the first direction, a fourth extending wiring portion extending in the second direction, and a second coupling wiring portion connecting the third extending wiring portion and the fourth extending wiring portion;
a second lead conductor having a first end connected with the second coupling wiring portion; and
a second capacitor having a first end connected with a second end of the second lead conductor and a second end connected with the ground,
wherein the first bus bar and the second bus bar are arranged in parallel with each other in a state where electrical insulation is maintained, and
the magnetic core is disposed in such a manner that the first coupling wiring portion and the second coupling wiring portion each pass through the opening.

3. The noise filter according to claim 1, wherein, in the magnetic core, a non-magnetic spacer is inserted in a part of a magnetic body.

4. A power supply device comprising the noise filter according to claim 1.

* * * * *